United States Patent
Ting et al.

(10) Patent No.: US 9,219,211 B1
(45) Date of Patent: Dec. 22, 2015

(54) METHOD FOR MANUFACTURING LIGHT EMITTING UNIT

(71) Applicant: Genesis Photonics Inc., Tainan (TW)

(72) Inventors: Shao-Ying Ting, Tainan (TW); Kuan-Chieh Huang, Tainan (TW); Jing-En Huang, Tainan (TW); Yi-Ru Huang, Tainan (TW); Sie-Jhan Wu, Tainan (TW); Long-Lin Ke, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 14/474,283

(22) Filed: Sep. 1, 2014

(30) Foreign Application Priority Data

Jul. 14, 2014 (TW) ............... 103124160 A

(51) Int. Cl.
| | | |
|---|---|---|
| *H01L 33/00* | (2010.01) | |
| *H01L 33/62* | (2010.01) | |
| *H01L 33/08* | (2010.01) | |
| *H01L 33/50* | (2010.01) | |
| *H01L 33/52* | (2010.01) | |
| *H05B 33/08* | (2006.01) | |
| *H01L 25/075* | (2006.01) | |
| *H01L 27/15* | (2006.01) | |

(52) U.S. Cl.
CPC ............... *H01L 33/62* (2013.01); *H01L 33/08* (2013.01); *H01L 33/50* (2013.01); *H01L 33/502* (2013.01); *H01L 33/52* (2013.01); *H05B 33/0803* (2013.01); *H05B 33/0806* (2013.01); *H05B 33/0827* (2013.01); *H01L 25/0753* (2013.01); *H01L 27/15* (2013.01)

(58) Field of Classification Search
CPC ..... H01L 25/0753; H01L 27/15; H01L 33/08; H01L 33/50; H01L 33/502; H01L 33/52; H01L 33/62; H05B 33/0803; H05B 33/0806; H05B 33/0827
See application file for complete search history.

(56) References Cited

U.S. PATENT DOCUMENTS

| | | |
|---|---|---|
| 7,329,905 B2 | 2/2008 | Ibbetson et al. |
| 2012/0025218 A1 | 2/2012 | Ito et al. |

FOREIGN PATENT DOCUMENTS

WO WO 2008/104103 * 4/2008

OTHER PUBLICATIONS

"Office Action of US Related Application, U.S. Appl. No. 14/474,277", issued on Mar. 26, 2015, p1-p10, in which the listed references were cited.
"Office Action of U.S.A. Counterpart Application", issued on Oct. 8, 2015, p1-p15.

* cited by examiner

*Primary Examiner* — Armando Rodriguez
(74) *Attorney, Agent, or Firm* — Jianq Chyun IP Office

(57) ABSTRACT

A method for manufacturing a light emitting unit is provided. A semiconductor structure including a plurality of light emitting dice separated from each other is provided. A molding compound is formed to encapsulate the light emitting dice. Each of the light emitting dice includes a light emitting element, a first electrode and a second electrode. A patterned metal layer is formed on the first electrodes and the second electrodes of the light emitting dice. A substrate is provided, where the molding compound is located between the substrate and the light emitting elements of the light emitting dice. A cutting process is performed to cut the semiconductor structure, the patterned metal layer, the molding compound and the substrate so as to define a light emitting unit with a series connection loop, a parallel connection loop or a series-parallel connection loop.

13 Claims, 9 Drawing Sheets

METHOD FOR MANUFACTURING LIGHT EMITTING UNIT

CROSS-REFERENCE TO RELATED APPLICATION

This application claims the priority benefit of Taiwan application serial no. 103124160, filed on Jul. 14, 2014. The entirety of the above-mentioned patent application is hereby incorporated by reference herein and made a part of this specification.

BACKGROUND

1. Technical Field

The invention relates to a light emitting unit, and particularly relates to a method for manufacturing a light emitting unit.

2. Related Art

Generally, series-parallel control of a light emitting unit composed of a plurality of light emitting diode (LED) chips on a circuit substrate is implemented according to a serial-parallel connection method of voltage values and current values provided by a power supplier when a circuit layout is designed on the circuit substrate. However, since types of the LED chips are plural, i.e. the voltage value and the current value required by each of the LED chips are different, when the light emitting unit is disposed on the circuit substrate, besides that it is difficult to achieve an optimal light emitting effect, the appearance and cost of the circuit substrate are also influenced due to modification of the circuit layout.

For example, if an initial design of the circuit layout of the circuit substrate is a circuit design of 4S1P, when a conversion efficiency test is performed to modify the initial design into a circuit design of 2S2P, since series-parallel modification cannot be implemented after the circuit layout is completed, jumpers, circuit disconnection or remanufacturing or re-planning of the circuit layout are required in order to achieve the required series-parallel design, by which not only a manufacturing cost is increased, a manufacturing time is also increased.

SUMMARY

The invention is directed to a method for manufacturing a light emitting unit capable of selectively forming different series connection loop, parallel connection loop or series-parallel connection loop through a cutting process.

The invention provides a method for manufacturing a light emitting unit, which includes following steps. A semiconductor structure including a plurality of light emitting dice separated from each other is provided, where each of the light emitting dice includes a light emitting element, a first electrode and a second electrode, the first electrode and the second electrode are disposed at a same side of the light emitting element, and the first electrode and the second electrode have a gap therebetween. A molding compound is formed to encapsulate the light emitting dice, where the molding compound encapsulates the light emitting element of each of the light emitting dice, and exposes the first electrode and the second electrode of each of the light emitting dice. A patterned metal layer is formed on the first electrodes and the second electrodes of the light emitting dice, where the patterned metal layer directly contact the first electrodes and the second electrodes of the light emitting dice, and extends from the first electrodes and the second electrodes to the molding compound. A substrate is provided, where the molding compound is located between the substrate and the light emitting elements of the light emitting dice. A cutting process is performed to cut the semiconductor structure, the patterned metal layer, the molding compound and the substrate so as to define a light emitting unit with a series connection loop, a parallel connection loop or a series-parallel connection loop.

In an embodiment of the invention, the molding compound is mixed with a phosphor material, and the phosphor material includes a yellow phosphor powder, a red phosphor powder, a green phosphor powder, a blue phosphor powder, a yttrium aluminium garnet phosphor powder or a combination of the above materials.

In an embodiment of the invention, the light emitting unit includes at least two light emitting dice, the first electrode of one light emitting dice is electrically connected to the second electrode of the other light emitting dice through the patterned metal layer to form the light emitting unit with the series connection loop.

In an embodiment of the invention, the light emitting unit includes at least two light emitting dice, the first electrode of one light emitting dice is electrically connected to the first electrode of the other light emitting dice through the patterned metal layer, and the second electrode of one light emitting dice is electrically connected to the second electrode of the other light emitting dice through the patterned metal layer, so as to form the light emitting unit with the parallel connection loop.

In an embodiment of the invention, the light emitting unit includes at least four light emitting dice, the first electrode of one light emitting dice is electrically connected to the first electrode of another light emitting dice through the patterned metal layer, the second electrode of one light emitting dice and the second electrode of another light emitting dice are electrically connected to the first electrode of still another light emitting dice and the first electrode of yet another light emitting dice through the patterned metal layer, and the second electrode of the still another light emitting dice is electrically connected to the second electrode of the yet another light emitting dice through the patterned metal layer, so as to form the light emitting unit with the series-parallel connection loop.

In an embodiment of the invention, a material of the patterned metal layer is the same with a material of the first electrode and the second electrode of each of the light emitting dice.

In an embodiment of the invention, a material of the patterned metal layer is different to a material of the first electrode and the second electrode of each of the light emitting dice.

In an embodiment of the invention, the method further includes providing an external circuit disposed under the light emitting unit, where the light emitting unit is electrically connected to the external circuit through the patterned metal layer.

In an embodiment of the invention, the external circuit includes a carrier board, a first external contact disposed on the carrier board and a second external contact disposed on the carrier board. The light emitting unit is electrically connected to the first external contact and the second external contact through the patterned metal layer.

In an embodiment of the invention, the external circuit includes a carrier board and a patterned circuit layer disposed on the carrier board and corresponding to the patterned metal layer, and the light emitting unit is electrically connected to the patterned circuit layer through the patterned metal layer.

In an embodiment of the invention, the patterned metal layer and the patterned circuit layer are conformally disposed.

In an embodiment of the invention, the method further includes providing a heat dissipation element disposed between the light emitting unit and the external circuit.

In an embodiment of the invention, a material of the substrate includes glass, ceramic or sapphire.

According to the above descriptions, the cutting process is performed to cut the semiconductor structure, the patterned metal layer, the molding compound and the substrate so as to define the light emitting unit with the series connection loop, the parallel connection loop or the series-parallel connection loop. Therefore, a user is capable of selecting a cutting region by himself according to a usage requirement, so as to form different circuit loop designs. In this way, according to the method for manufacturing the light emitting unit of the invention, the user has better manufacturing flexibility, and the manufactured light emitting unit has circuit loop designs of a plurality of patterns.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
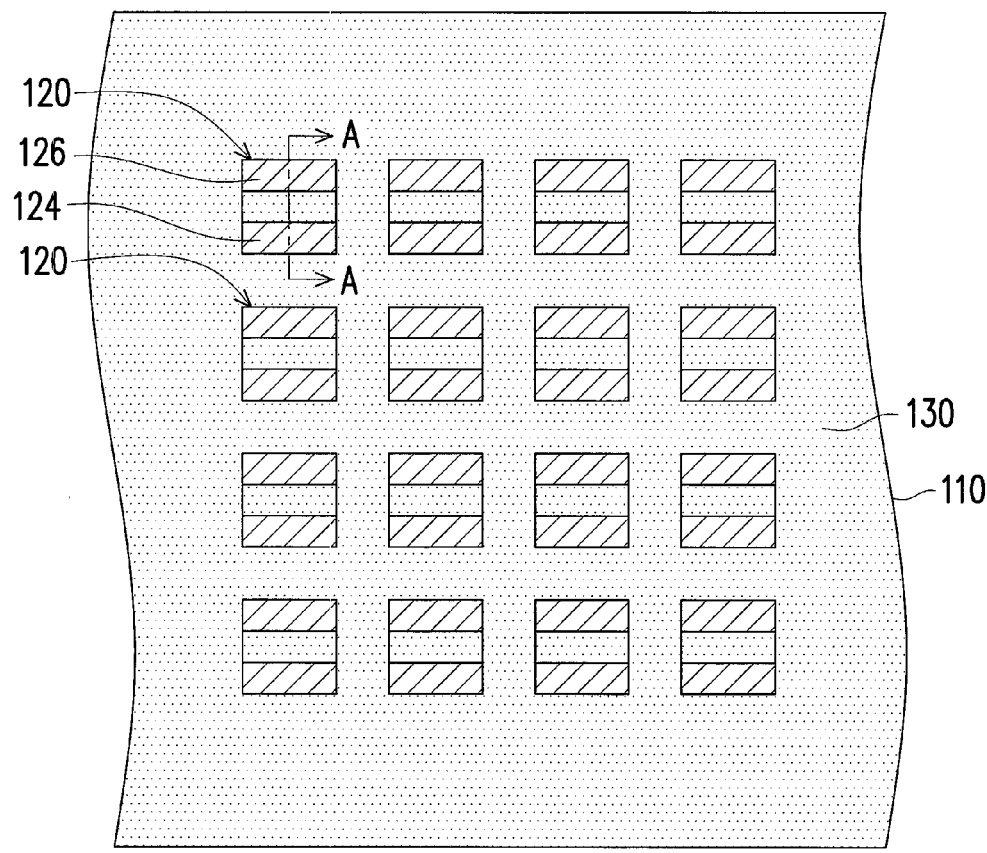
FIG. 1 to FIG. 5 are schematic diagrams of a method for manufacturing a light emitting unit according to an embodiment of the invention.
Figure 2:
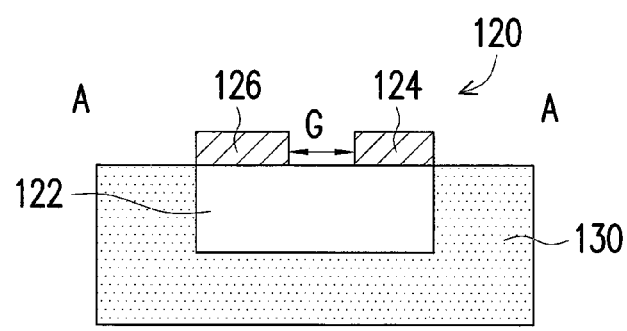
Figure 3:
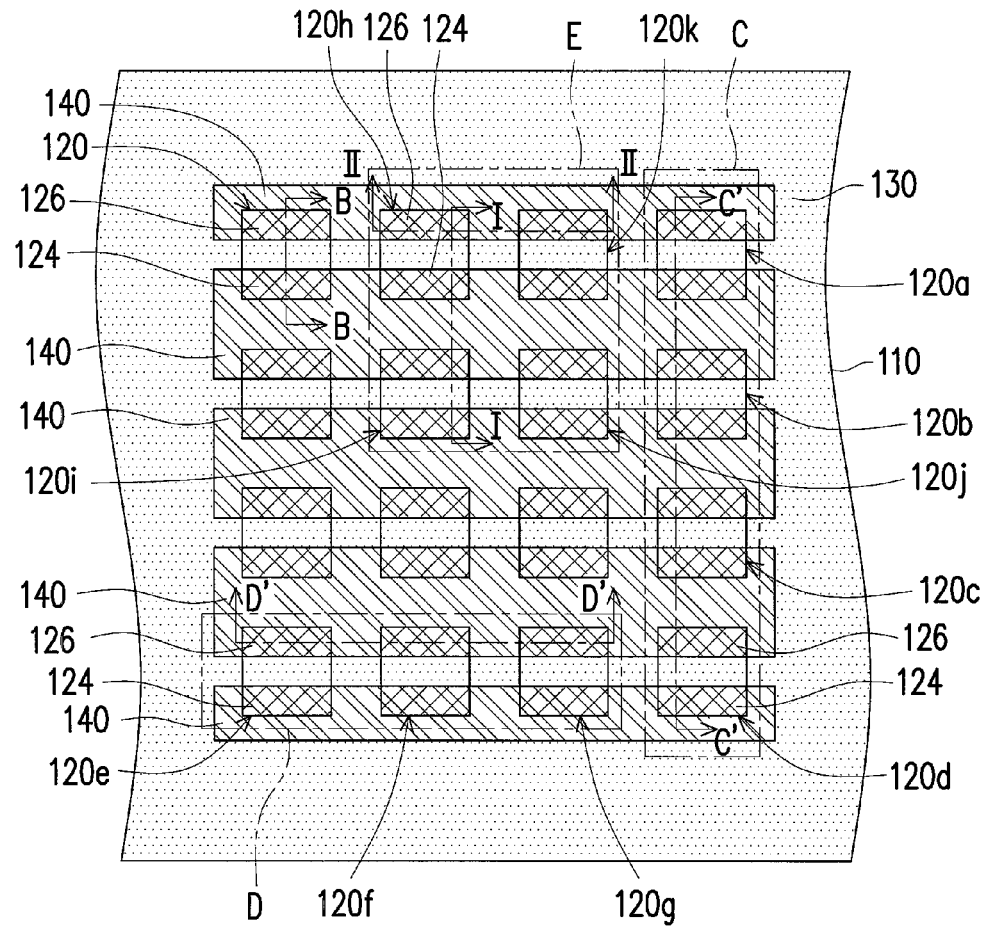
Figure 4:
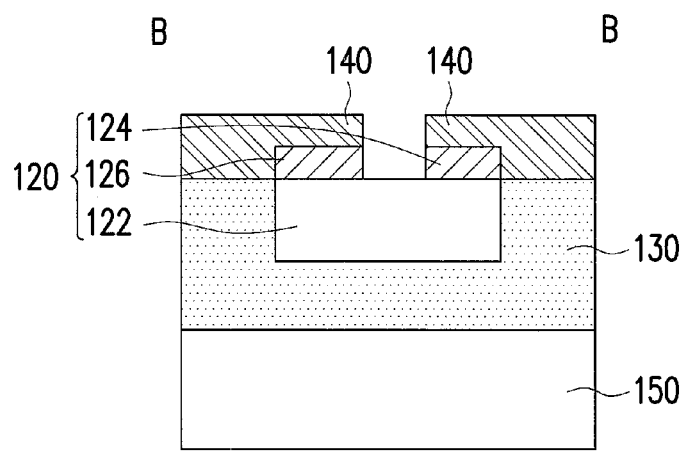
Figure 5:
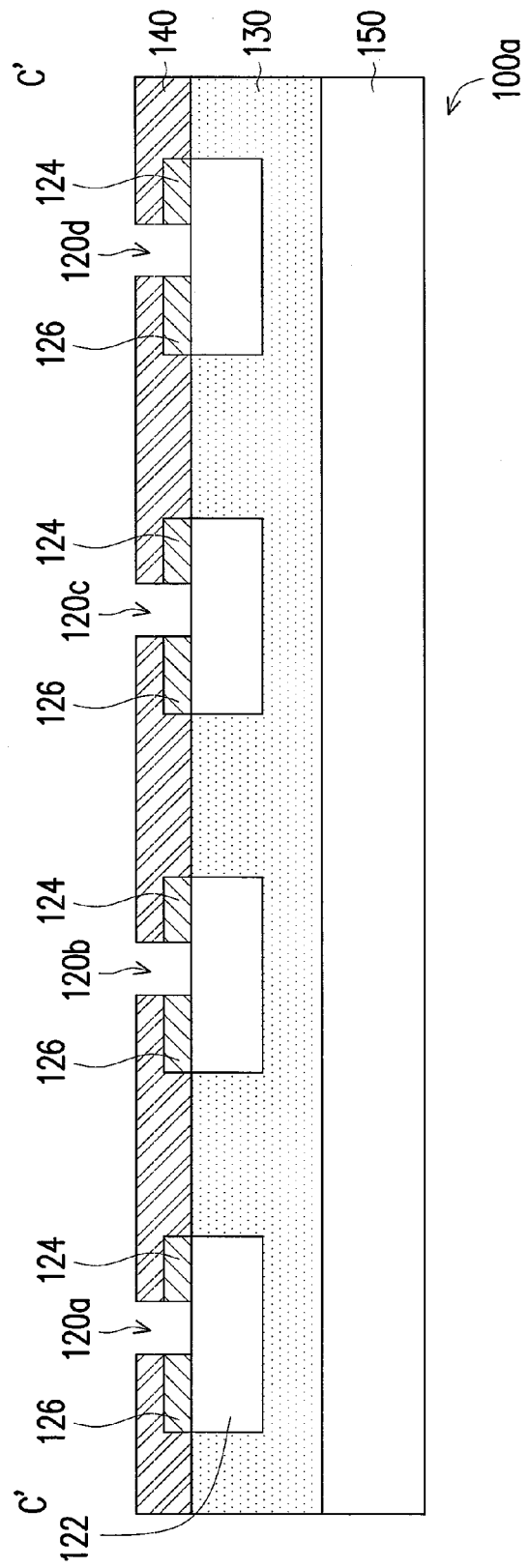

FIG. 1 to FIG. 5 are schematic diagrams of a method for manufacturing a light emitting unit according to an embodiment of the invention. For simplicity's sake, FIG. 1 and FIG. 3 are top views of a semiconductor structure 110 according to an embodiment of the invention, FIG. 2 is a cross-sectional view of FIG. 1 along a line A-A, FIG. 4 is a cross-sectional view of FIG. 3 along a line B-B, and FIG. 5 is a cross-sectional view of FIG. 3 along a line C'-C' obtained after the semiconductor structure 110 is cut along a cutting region C.

Referring to FIG. 1 and FIG. 2, according to the method for manufacturing a light emitting unit of the present embodiment of the invention, first, the semiconductor structure 110 including a plurality of light emitting dice 120 separated from each other is provided, where each of the light emitting dice 120 includes a light emitting element 122, a first electrode 124 and a second electrode 126, the first electrode 124 and the second electrode 126 are disposed at a same side of the light emitting element 122, and the first electrode 124 and the second electrode 126 have a gap G therebetween. As shown in FIG. 2, the first electrode 124 and the second electrode 126 of the present embodiment are substantially designed to be coplanar, though the invention is not limited thereto. The light emitting element 122 of each light emitting dice 120 may include a substrate (not shown), a light emitting layer (not shown) and a second type semiconductor layer (not shown), though the invention is not limited thereto. A light color of each of the light emitting dice 120 can be the same or different, which is determined according to an actual design requirement. The first electrode 124 and a first type semiconductor layer (not shown) directly contact each other and are electrically connected. The second electrode 126 and the second type semiconductor layer (not shown) directly contact each other and are electrically connected.

Then, referring to FIG. 1 and FIG. 2, a molding compound 130 is formed to encapsulate the light emitting dice 120, where the molding compound 130 encapsulates the light emitting element 122 of each of the light emitting dice 120, and exposes the first electrodes 124 and the second electrodes 126 of at least a part of the light emitting dice 120.

Then, referring to FIG. 3, a patterned metal layer 140 is formed on the first electrodes 124 and the second electrodes 126 of the light emitting dice 120, where the patterned metal layer 140 directly contact the first electrodes 124 and the second electrodes 126 of the light emitting dice 120, and extends from the first electrodes 124 and the second electrodes 126 to the molding compound 130. It should be noticed that a material of the patterned metal layer 140 of the present embodiment can be the same with a material of the first electrode 124 and the second electrode 126 of each light emitting dice 120, where the material of the patterned metal layer 140 and the material of the first electrode 124 and the second electrode 126 of each light emitting dice 120 is, for example, Pt, Au, Ag, Ni, Ti, In, Sn, Bi, an alloy of the above materials or a combination of the above materials. Alternatively, the material of the patterned metal layer 140 is different to the material of the first electrode 124 and the second electrode 126 of each light emitting dice 120, where the material of the patterned metal layer 140 is, for example, Pt, Au, Ag, Ni, Ti, In, Sn, Bi, an alloy of the above materials or a combination of the above materials, and the material of the first electrode 124 and the second electrode 126 of each light emitting dice 120 is, for example, Pt, Au, In, Sn, Bi, an alloy of the above materials or a combination of the above materials.

Then, referring to FIG. 4, a substrate 150 is provided, where the molding compound 130 is located between the substrate 150 and the light emitting elements 122 of the light emitting dice 120. The substrate 150 of the present embodiment has a material of glass, acryl, ceramic or sapphire or other transparent materials, and is used for supporting the semiconductor structure 110, and avails a light emitting and light guiding effect of the light emitting dice 120. Preferably, the material of the substrate 150 is glass, which has a characteristic of easy cutting to simplify the manufacturing process.

Finally, referring to FIG. 3 and FIG. 5, a cutting process is performed to cut the semiconductor structure 110, the patterned metal layer 140, the molding compound 130 and the substrate 150 so as to define a light emitting unit 100a with a series connection loop, a parallel connection loop or a series-parallel connection loop. In detail, the cutting process of the present embodiment is to cut along a cutting region C of FIG. 3, and the formed light emitting unit 100a includes at least two light emitting dice (four light emitting dice are schematically illustrated in FIG. 5, which are respectively denoted by 120a, 120b, 120c and 120d for simplicity's sake). The first electrode 124 of the light emitting dice 120a is electrically connected to the second electrode 126 of the light emitting dice 120b through the patterned metal layer 140; the first electrode 124 of the light emitting dice 120b is electrically connected to the second electrode 126 of the light emitting dice 120c through the patterned metal layer 140; and the first electrode 124 of the light emitting dice 120c is electrically connected to the second electrode 126 of the light emitting dice 120d through the patterned metal layer 140, so as to form the light emitting unit 100a with the series connection loop (i.e. 4S).

Although the light emitting unit 100a with the series connection loop (i.e. 4S) is formed after the cutting process, in other embodiments, the cutting region can be changed according to an actual requirement of the user to form the light emitting unit of different circuit loops.

Figure 6:
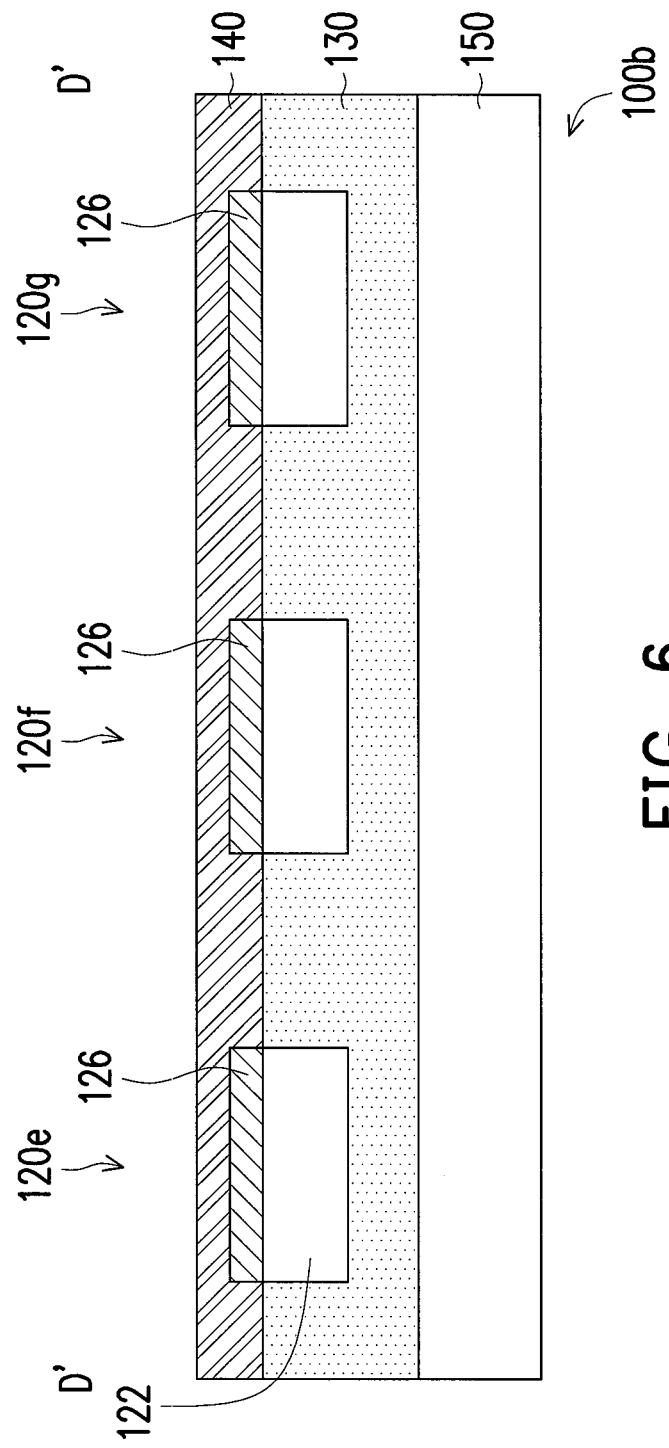
FIG. 6 is a cross-sectional view of a light emitting unit according to another embodiment of the invention.

For example, referring to FIG. 3 and FIG. 6, FIG. 6 is a cross-sectional view of FIG. 3 along a line D'-D' obtained after the semiconductor structure 110 is cut along a cutting region D. The cutting process of the present embodiment is to cut along the cutting region D of FIG. 3, and the formed light emitting unit 100b includes at least two light emitting dice (three light emitting dice are schematically illustrated in FIG. 6, which are respectively denoted by 120e, 120f and 120g for simplicity's sake). The first electrode 124 of the light emitting dice 120e, the first electrode 124 of the light emitting dice 120f and the first electrode 124 of the light emitting dice 120g are electrically connected to each other through the patterned metal layer 140, and the second electrode 126 of the light emitting dice 120e, the second electrode 126 of the light emitting dice 120f and the second electrode 126 of the light emitting dice 120g are electrically connected to each other through the patterned metal layer 140, so as to form the light emitting unit 100a with the parallel connection loop (i.e. 3P).

Figure 7A:
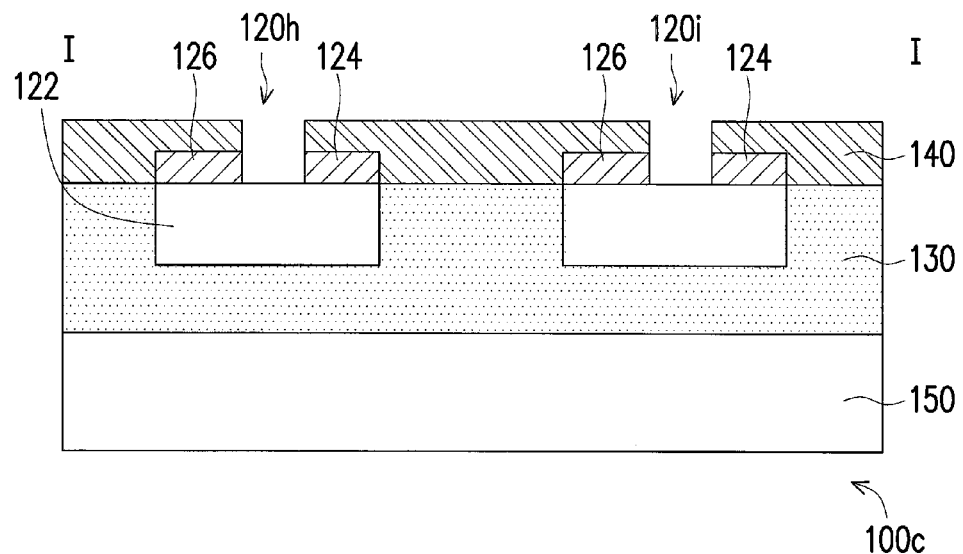
FIG. 7A and FIG. 7B are cross-sectional views of different cross-sections of a light emitting unit viewing according to still another embodiment of the invention.
Figure 7B:
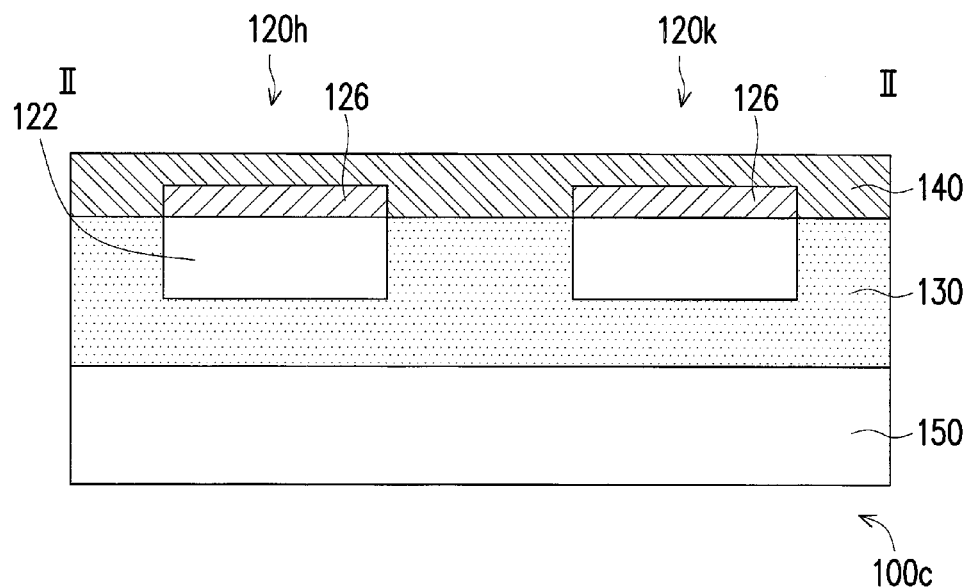

Alternatively, referring to FIG. 3, FIG. 7A and FIG. 7B, FIG. 7A and FIG. 7B are cross-sectional views of FIG. 3 obtained after cutting along a cutting region E, where FIG. 7A is a cross-sectional view of FIG. 3 along a line I-I, and FIG. 7B is a cross-sectional view of FIG. 3 along a line The cutting process of the present embodiment is to cut along the cutting region E of FIG. 3, and the formed light emitting unit 100c includes at least four light emitting dice (four light emitting dice are schematically illustrated in FIG. 3, which are respectively denoted by 120h, 120i, 102j and 120k for simplicity's sake). The second electrode 126 of the light emitting dice 120h is electrically connected to the second electrode 126 of the light emitting dice 120k through the patterned metal layer 140 (referring to FIG. 3 and FIG. 7B), the first electrode 124 of the light emitting dice 120h and the first electrode 124 of the light emitting dice 120k are electrically connected to the second electrode 126 of the light emitting dice 120i and the second electrode 126 of the light emitting dice 120j through the patterned metal layer 140 (referring to FIG. 3 and FIG. 7A), and the first electrode 124 of the light emitting dice 120i is electrically connected to the first electrode 124 of the light emitting dice 120j through the patterned metal layer 140, so as to form the light emitting unit 100c with the series-parallel connection loop (i.e. 2S2P).

In other embodiments that are not illustrated, those skilled in the art can select the cutting region on the semiconductor structure 110 by themselves according to an actual requirement by referring to descriptions of the aforementioned embodiments, so as to form the light emitting unit with the required circuit loop (for example, 2S3P, 4S1P, etc.).

Moreover, it should be noticed that the patterned metal layer 140 of the present embodiment covers the first electrodes 124 and the second electrodes 126 of the light emitting dice 120 and extends to a part of the molding compound 130. Namely, the patterned metal layer 140 may increase a contact area of the first electrodes 124 and the second electrodes 126 of the light emitting dice 120, which avails assembling the light emitting units 100a, 100b and 100c formed after the cutting process with an external circuit, by which an alignment accuracy and assembling efficiency are effectively improved.

Figure 8:
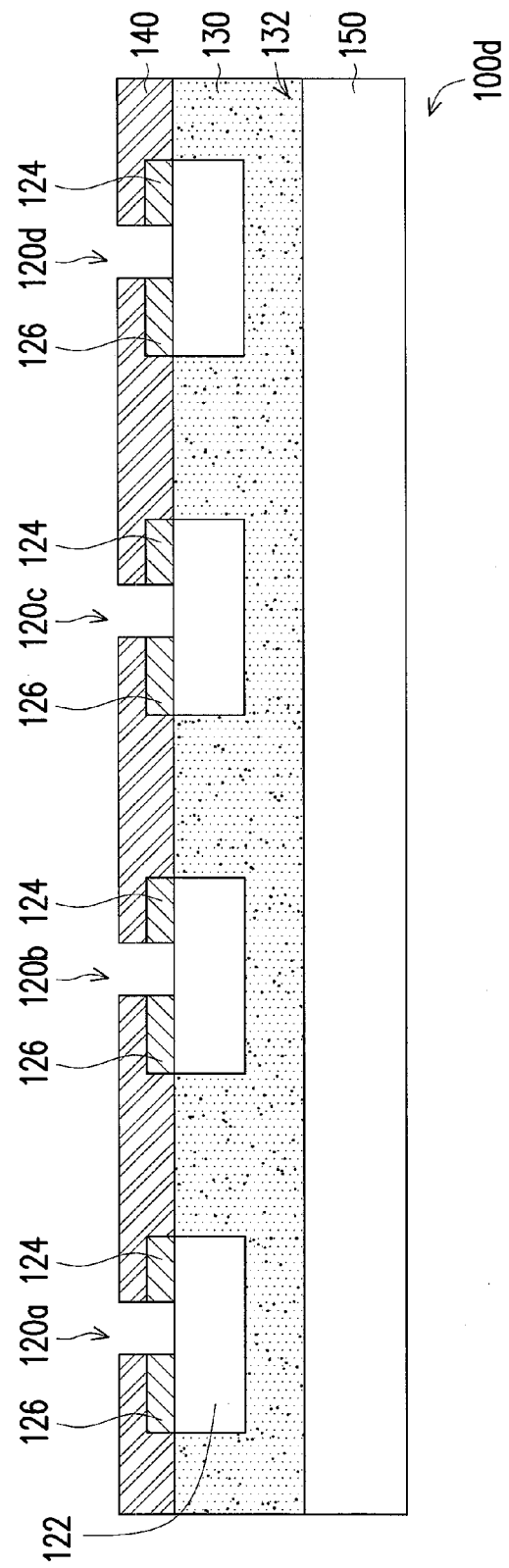
FIG. 8 is a cross-sectional view of a light emitting unit according to still another embodiment of the invention.

Moreover, referring to FIG. 8, FIG. 8 is a cross-sectional view of a light emitting unit according to another embodiment of the invention. The light-emitting unit 100d of the present embodiment is similar to the light emitting unit 100a of FIG. 5, and a difference therebetween is that in order to change a light emitting color of the light emitting unit, a phosphor material 132 is mixed in the molding compound 130, where the phosphor material 132 is, for example, a yellow phosphor powder, a red phosphor powder, a green phosphor powder, a blue phosphor powder, a yttrium aluminium garnet phosphor powder or a combination of the above materials.

Figure 9:
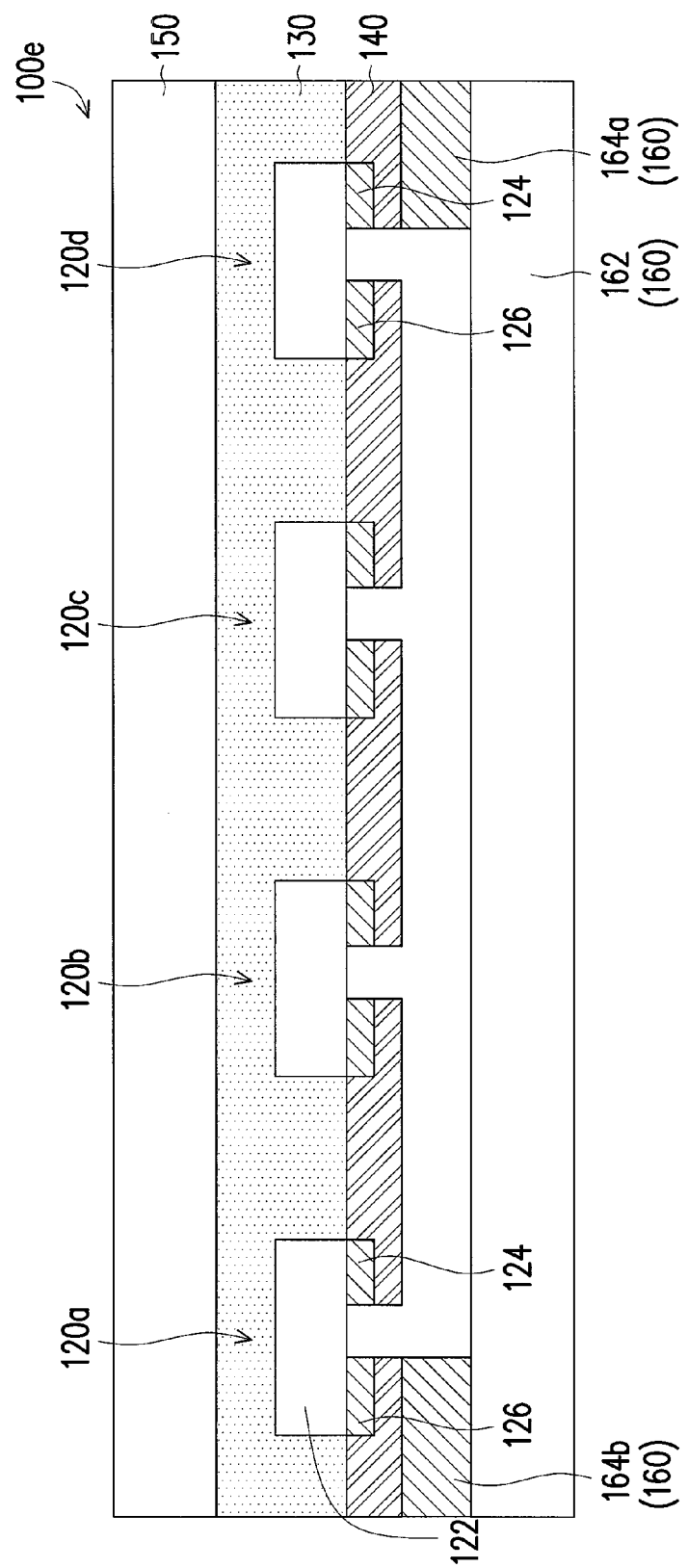
FIG. 9 is a cross-sectional view of a light emitting unit according to still another embodiment of the invention.

FIG. 9 is a cross-sectional view of a light emitting unit according to still another embodiment of the invention. Referring to FIG. 9, the method for manufacturing the light emitting unit 100e further includes providing an external circuit 160, where the external circuit 160 is disposed under the light emitting unit 100e, and the light emitting unit 100e is electrically connected to the external circuit 160 through the patterned metal layer 140. For example, the external circuit 160 of the present embodiment is, for example, a circuit substrate, which includes a carrier board 162, a first external contact 164a and a second external contact 164b. In detail, the light emitting unit 100e is electrically connected to the first external contact 164a and the second external contact 164b through the patterned metal layer 140. Since the light emitting dice 120a, 120b, 120c and 120d are electrically connected through the patterned metal layer 140, by respectively imposing positive electricity and negative electricity to the first external contact 164a and the second external contact 164b of the external circuit 160, the light emitting unit 100e is driven to emit light, and it is unnecessary to additionally modify a circuit layout the external circuit 160, by which better usage flexibility is achieved.

Figure 10:
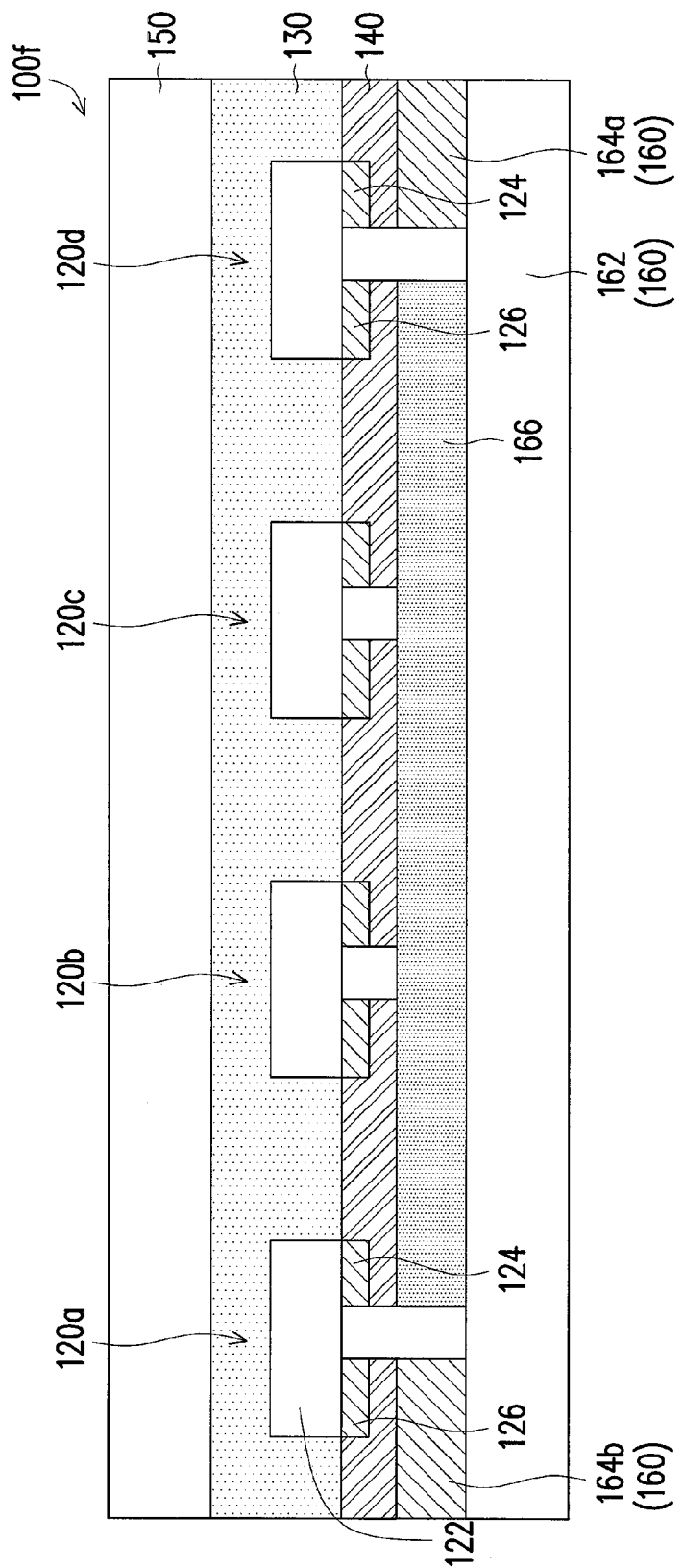
FIG. 10 is a cross-sectional view of a light emitting unit according to still another embodiment of the invention.

Particularly, as shown in FIG. 10, in another embodiment, the light emitting unit 100f may further include a heat dissipation element 166, where the heat dissipation element 166 is disposed between the light emitting unit 100f and the external circuit 160 to effectively enhance a heat dissipation efficiency, though the invention is not limited thereto.

Figure 11:
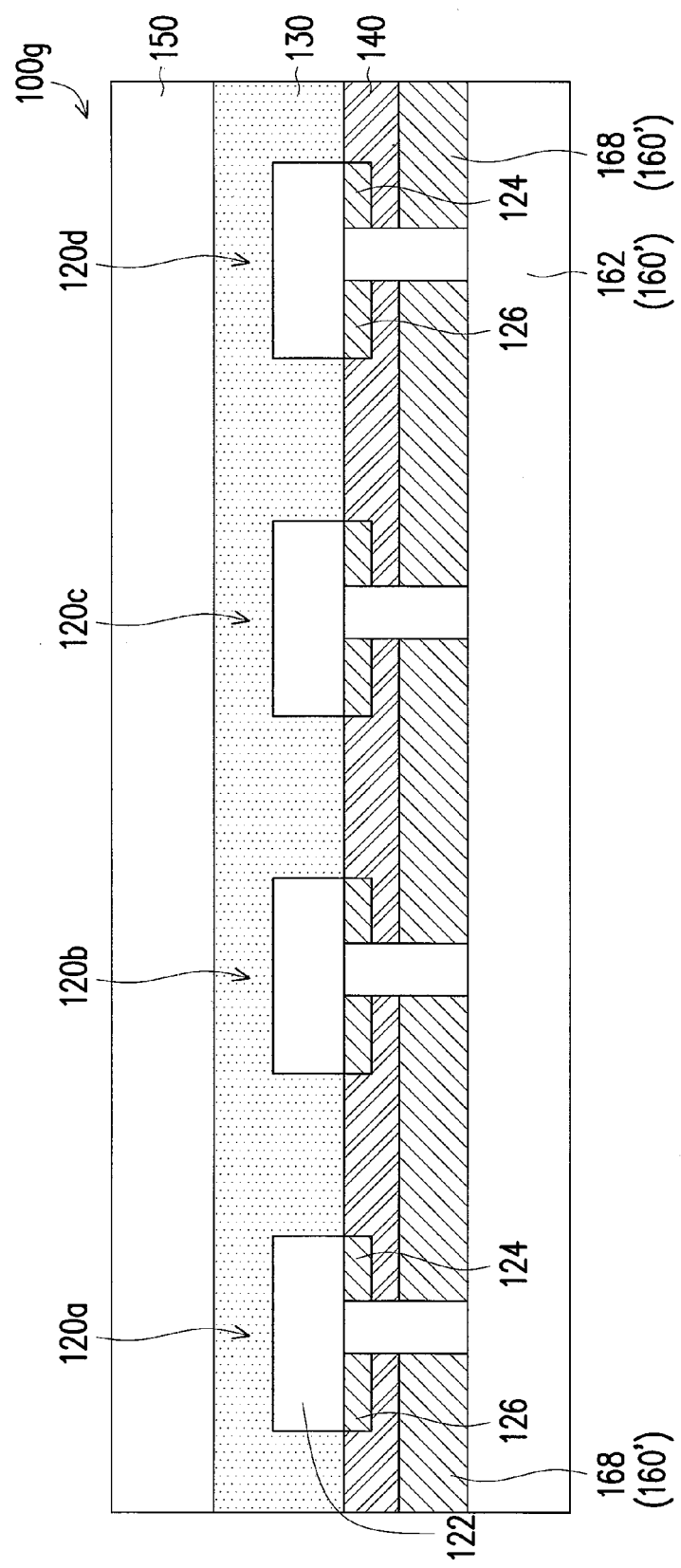
FIG. 11 is a cross-sectional view of a light emitting unit according to still another embodiment of the invention.

FIG. 11 is a cross-sectional view of a light emitting unit according to yet another embodiment of the invention. Referring to FIG. 9 and FIG. 11, a difference between the light emitting unit 100g of the present embodiment and the light emitting unit 100e of the embodiment of FIG. 9 is that the external circuit 160' of the present embodiment includes a carrier board 162 and a patterned circuit layer 168 disposed on the carrier board 162 and corresponding to the patterned metal layer 140, and the light emitting unit 100g is electrically connected to the patterned circuit layer 168 through the patterned metal layer 140. Preferably, the patterned metal layer 140 and the patterned circuit layer 168 are conformally disposed on the carrier board 162 to achieve larger head dissipation area and alignment area, though the invention is not limited thereto.

In summary, the cutting process is performed to cut the semiconductor structure, the patterned metal layer, the molding compound and the substrate so as to define the light emitting unit with the series connection loop, the parallel connection loop or the series-parallel connection loop. Therefore, the user is capable of selecting a cutting region by himself according to a usage requirement, so as to form different circuit loop designs. In this way, according to the method for manufacturing the light emitting unit of the invention, the user has better manufacturing flexibility, and the manufactured light emitting unit may have circuit loop designs of a plurality of patterns.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for manufacturing a light emitting unit, comprising:
    providing a semiconductor structure comprising a plurality of light emitting dice separated from each other, wherein each of the light emitting dice comprises a light emitting element, a first electrode and a second electrode, the first electrode and the second electrode are disposed at a same side of the light emitting element, and the first electrode and the second electrode have a gap therebetween;
    forming a molding compound to encapsulate the light emitting dice, wherein the molding compound encapsulates the light emitting element of each of the light emitting dice, and exposes the first electrode and the second electrode of each of the light emitting dice;
    forming a patterned metal layer on the first electrodes and the second electrodes of the light emitting dice, wherein the patterned metal layer directly contact the first electrodes and the second electrodes of the light emitting dice, and extends from the first electrodes and the second electrodes to the molding compound;
    providing a substrate, wherein the molding compound is located between the substrate and the light emitting elements of the light emitting dice; and
    performing a cutting process to cut the semiconductor structure, the patterned metal layer, the molding compound and the substrate so as to define a light emitting unit with a series connection loop, a parallel connection loop or a series-parallel connection loop.

2. The method for manufacturing the light emitting unit as claimed in claim 1, wherein the molding compound is mixed with a phosphor material, and the phosphor material comprises a yellow phosphor powder, a red phosphor powder, a green phosphor powder, a blue phosphor powder, a yttrium aluminium garnet phosphor powder or a combination of the above materials.

3. The method for manufacturing the light emitting unit as claimed in claim 1, wherein the light emitting unit comprises at least two light emitting dice, the first electrode of one light emitting dice is electrically connected to the second electrode of the other light emitting dice through the patterned metal layer to form the light emitting unit with the series connection loop.

4. The method for manufacturing the light emitting unit as claimed in claim 1, wherein the light emitting unit comprises at least two light emitting dice, the first electrode of one light emitting dice is electrically connected to the first electrode of the other light emitting dice through the patterned metal layer, and the second electrode of one light emitting dice is electrically connected to the second electrode of the other light emitting dice through the patterned metal layer, so as to form the light emitting unit with the parallel connection loop.

5. The method for manufacturing the light emitting unit as claimed in claim 1, wherein the light emitting unit comprises at least four of the light emitting dice, the first electrode of one light emitting dice is electrically connected to the first electrode of another light emitting dice through the patterned metal layer, the second electrode of one light emitting dice and the second electrode of another light emitting dice are electrically connected to the first electrode of still another light emitting dice and the first electrode of yet another light emitting dice through the patterned metal layer, and the second electrode of the still another light emitting dice is electrically connected to the second electrode of the yet another light emitting dice through the patterned metal layer, so as to form the light emitting unit with the series-parallel connection loop.

6. The method for manufacturing the light emitting unit as claimed in claim 1, wherein a material of the patterned metal layer is the same with a material of the first electrode and the second electrode of each of the light emitting dice.

7. The method for manufacturing the light emitting unit as claimed in claim 1, wherein a material of the patterned metal layer is different to a material of the first electrode and the second electrode of each of the light emitting dice.

8. The method for manufacturing the light emitting unit as claimed in claim 1, further comprising:
    providing an external circuit disposed under the light emitting unit, wherein the light emitting unit is electrically connected to the external circuit through the patterned metal layer.

9. The method for manufacturing the light emitting unit as claimed in claim 8, wherein the external circuit comprises a carrier board, a first external contact disposed on the carrier board and a second external contact disposed on the carrier board, the light emitting unit is electrically connected to the first external contact and the second external contact through the patterned metal layer.

10. The method for manufacturing the light emitting unit as claimed in claim 8, wherein the external circuit comprises a carrier board and a patterned circuit layer disposed on the carrier board and corresponding to the patterned metal layer, and the light emitting unit is electrically connected to the patterned circuit layer through the patterned metal layer.

11. The method for manufacturing the light emitting unit as claimed in claim 10, wherein the patterned metal layer and the patterned circuit layer are conformally disposed.

12. The method for manufacturing the light emitting unit as claimed in claim 8, further comprising:
    providing a heat dissipation element disposed between the light emitting unit and the external circuit.

13. The method for manufacturing the light emitting unit as claimed in claim 1, wherein a material of the substrate comprises glass, ceramic or sapphire.

* * * * *